United States Patent
Huang et al.

(10) Patent No.: US 11,523,239 B2
(45) Date of Patent: Dec. 6, 2022

(54) DISPLAY APPARATUS AND METHOD FOR PROCESSING AUDIO

(71) Applicant: HISENSE VISUAL TECHNOLOGY CO., LTD., Qingdao (CN)

(72) Inventors: Weicai Huang, Qingdao (CN); Jianxin Yang, Qingdao (CN); Chan Zhang, Qingdao (CN)

(73) Assignee: HISENSE VISUAL TECHNOLOGY CO., LTD., Qingdao (CN)

( * ) Notice: Subject to any disclaimer, the term of this patent is extended or adjusted under 35 U.S.C. 154(b) by 296 days.

(21) Appl. No.: 16/869,386

(22) Filed: May 7, 2020

(65) Prior Publication Data

US 2021/0029481 A1    Jan. 28, 2021

Related U.S. Application Data

(63) Continuation of application No. PCT/CN2020/076127, filed on Feb. 21, 2020.

(30) Foreign Application Priority Data

Jul. 22, 2019  (CN) .......................... 201910659610.5

(51) Int. Cl.
*H04S 7/00* (2006.01)
*G10L 19/008* (2013.01)
(Continued)

(52) U.S. Cl.
CPC .............. *H04S 7/30* (2013.01); *G10L 19/008* (2013.01); *H04R 3/04* (2013.01); *H04R 5/02* (2013.01);
(Continued)

(58) Field of Classification Search
CPC ................................... H04S 7/30; H04S 7/00
See application file for complete search history.

(56) References Cited

U.S. PATENT DOCUMENTS 8,553,895 B2 * 10/2013 Plogsties ................. H04S 3/004
  381/23
9,872,121 B1 * 1/2018 Xu ........................... H04S 3/008
(Continued)

FOREIGN PATENT DOCUMENTS

CN        1365246 A      8/2002
CN      101014998 A      8/2007
(Continued)

OTHER PUBLICATIONS

International Search Report.
(Continued)

*Primary Examiner* — Olisa Anwah
(74) *Attorney, Agent, or Firm* — J.C. Patents

(57) ABSTRACT

A display apparatus and a method for processing audio are provided, the display apparatus includes a circuit board provided with a hybrid circuit, a filter circuit and a speaker; the hybrid circuit is configured to receive an original audio signal and superpose a first sub-signal of the original audio signal on a second sub-signal of the original audio signal to obtain a hybrid audio signal; the first sub-signal includes at least one channel of audio signal, the second sub-signal includes at least two channels of audio signal; the filter circuit is configured to filter the hybrid audio signal according to a frequency characteristic of the first sub-signal and the second sub-signal to obtain a restored original audio signal; and the speaker, connected with the filter circuit, is configured to output the restored original audio signal.

15 Claims, 4 Drawing Sheets

(51) Int. Cl.
  *H04R 3/04* (2006.01)
  *H04R 5/02* (2006.01)
  *H04R 5/04* (2006.01)
  *H04S 3/00* (2006.01)
  *H03F 3/20* (2006.01)

(52) U.S. Cl.
  CPC .............. *H04R 5/04* (2013.01); *H04S 3/008* (2013.01); *H03F 3/20* (2013.01); *H03F 2200/03* (2013.01); *H04R 2499/15* (2013.01); *H04S 2400/01* (2013.01)

(56) References Cited

U.S. PATENT DOCUMENTS

| | | | | |
|---|---|---|---|---|
| 2004/0008847 | A1* | 1/2004 | Kim | ................. H04S 5/005 381/27 |
| 2017/0332185 | A1* | 11/2017 | Villemoes | ............. G10L 19/008 |
| 2017/0374484 | A1* | 12/2017 | Lando | ..................... H04R 5/02 |
| 2018/0115849 | A1* | 4/2018 | Breebaart | ............... H04S 3/008 |
| 2020/0314541 | A1* | 10/2020 | Tracy | ..................... H04R 1/026 |

FOREIGN PATENT DOCUMENTS

| | | |
|---|---|---|
| CN | 101133680 A | 2/2008 |
| CN | 101243488 A | 8/2008 |
| CN | 201315645 Y | 9/2009 |
| JP | 201315645 Y | 12/2013 |
| JP | 2013255049 A | 12/2013 |
| WO | WO2019021276 A | 1/2019 |

OTHER PUBLICATIONS

The first Office Action of CN application No. 201910659610.5.
The Rejection Decision of CN application No. 201910659610.5.
"Frequency division multiplexing", Computer Communication; Publication date: Dec. 31, 2002; Author: Yang Yongtian; Related pp. 99-101.

* cited by examiner

DISPLAY APPARATUS AND METHOD FOR PROCESSING AUDIO

CROSS REFERENCE TO RELATED APPLICATION

This application is a continuation of the International Application No. PCT/CN2020/076127, filed on Feb. 21, 2020, which claims the priority of Chinese patent application No. 201910659610.5, filed on Jul. 22, 2019, entitled "DISPLAY APPARATUS", and the contents of the above identified two applications are incorporated herein by reference in their entireties.

TECHNICAL FIELD

Embodiments of the present disclosure relate to the technical field of audio processing and, in particular, to a display apparatus and a method for processing audio.

BACKGROUND

Most television sound systems output a two-channel 2.0 audio signal (i.e., left main-channel audio signal and right main-channel audio signal) by an Inter-IC Sound (I2S) from a host chip, and can output at most three I2S, thus at most supporting a six-channel audio signal (left main-channel audio signal, right main-channel audio signal, left surround audio signal, right surround audio signal, center-channel audio signal, and strong bass audio signal).

SUMMARY

In one aspect, embodiments of the present disclosure provide a display apparatus including a circuit board. The circuit board comprises a hybrid circuit, a filter circuit, and a speaker; the hybrid circuit is configured to receive an original audio signal, and superpose a first sub-signal of the original audio signal and a second sub-signal of the original audio signal to obtain a hybrid audio signal, wherein the number of channels of the hybrid audio signal is less than the number of channels of the original audio signal, and the first sub-signal includes at least one channel of audio signal, and the second sub-signal includes at least two channels of audio signal; the filter circuit, in connection with the hybrid circuit, is configured to filter the hybrid audio signal according to a frequency characteristic of the first sub-signal and the second sub-signal to obtain a restored original audio signal; and the speaker, in connection with the filter circuit, is configured to output the restored original audio signal.

In another aspect, embodiments of the present disclosure provide a method for processing audio, including: receiving an original audio signal through a hybrid circuit, and superposing a first sub-signal of the original audio signal and a second sub-signal of the original audio signal to obtain a hybrid audio signal, wherein the number of channels of the hybrid audio signal is less than the number of channels of the original audio signal, the first sub-signal includes at least one channel of audio signal, and the second sub-signal includes at least two channels of audio signal; filtering the hybrid audio signal according to a frequency characteristic of the first sub-signal and the second sub-signal through a filter circuit to obtain a restored original audio signal, wherein the filter circuit is connected with the hybrid circuit; and outputting the restored original audio signal through a speaker, wherein the speaker is connected with the filter circuit.

BRIEF DESCRIPTION OF DRAWINGS

In order to illustrate embodiments of the present disclosure or the technical scheme in the related art, the accompanying drawings that are required in the embodiments or in the related technical description will be briefly described in the following. It will be apparent that the accompanying drawings in the following description are some embodiments of the present disclosure. Other drawings may be obtained by those of ordinary skill in the art in accordance with these drawings without creative effort.

Figure 1:
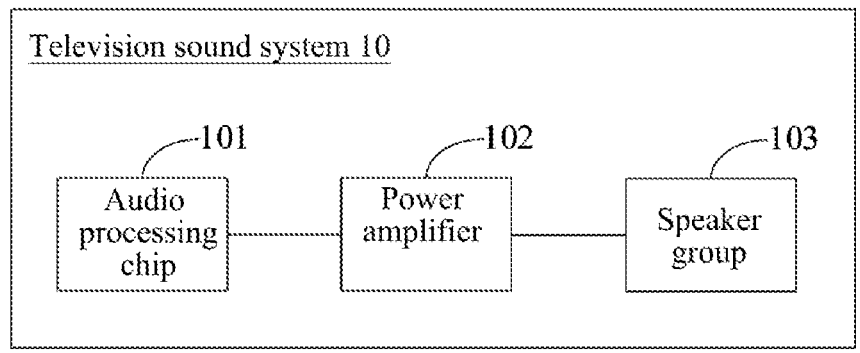
FIG. 1 is a schematic architectural diagram of a television sound system according to an embodiment of the present disclosure.

REFERENCE NUMERALS television sound system 10; audio processing module 101; power amplifier 102; speaker group 103; display apparatus 200; circuit board 210; hybrid circuit 220; first addition circuit 221; first attenuation circuit 222; filter circuit 230; high-pass filter circuit 231; first band-pass filter circuit 232; second band-pass filter circuit 233; second attenuation circuit 234; first power amplifier circuit 235; second power amplifier circuit 236; third power amplifier circuit 237; fourth power amplifier circuit 238; fifth power amplifier circuit 239; speaker 240; first sub-speaker 241; first left speaker 2411; first right speaker 2412; second sub-speaker 242; third sub-speaker 243; fourth sub-speaker 244; fourth left speaker 2441; fourth right speaker 2442; fifth sub-speaker 245; fifth left speaker 2451; fifth right speaker 2452; decoding circuit 250.

DESCRIPTION OF EMBODIMENTS

Exemplary embodiments are provided so that this disclosure will be clear and complete, and fully convey the scope to those skilled in the art. Numerous specific details are set forth such as examples of specific components, devices, and methods, to provide a thorough understanding of embodiments of the present disclosure. It will be apparent to those skilled in the art that specific details are not necessarily to be employed and exemplary embodiments may be embodied in many different forms, and none of those should be construed to limit the scope of the disclosure. In some exemplary embodiments, well-known processes, well-known device structures, and well-known technologies are not described in detail.

The terminology used herein is for the purpose of describing particular embodiments only and is not intended to be limiting. As used herein, the singular forms "a", "an", and "the" may be intended to include the plural forms as well, unless the context clearly indicates otherwise. The terms "comprise", "comprising", "including", and "having", are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first", "second" and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner", "outer", "beneath", "below", "lower", "above", "upper", and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

FIG. 1 is a schematic architectural diagram of a television sound system according to an embodiment of the present disclosure. As shown in FIG. 1, the television audio system 10 includes an audio processing module 101, a power amplifier 102 and a speaker group 103. The audio processing module 101 is connected with the speaker group 103 through the power amplifier 102. During the operation of the system, the audio processing module 101 receives an audio signal to be processed, and performs processing such as decoding and filtering on the audio signal to be processed, then outputs the processed audio signal to the power amplifier 102, which amplifies the processed audio signal and plays it through the speaker group 103. The audio processing module 101 in the system may be an integrated system on chip (SOC).

If a two-channel audio signal is received, and the audio processing module 101 also outputs two-channel, the two-channel audio signal finally played by the speaker is able to completely reproduce the two-channel audio signal received, However, if a four-channel or six-channel audio signal is received, and for an audio processing module 101 with just a two-channel output, it may only play a two-channel audio signal, as a result, the audio quality may be lost to some extent.

In the related art, in order to achieve Dolby Atmos effect, 8-channel sound system has been proposed, such as 5.1.2-channel (front left channel, front right channel, left surround, right surround and center-channel are the 5-channel, subwoofer channel is the 0.1 channel, left height channel and right height channel are the 0.0.2 channels) sound source, or even a sound source with 10-channel, such as 7.1.2-channel.

However, at present, chips of a television sound system can only support an audio signal of up to 6-channel. When processing an audio signal of more than 6-channel, such as 5.1.2-channel, in most cases, the 8-channel audio signal is hybridized into an audio signal of 2-channel for output and play, which makes it hard to achieve Dolby Atmos effect, therefore wasting audio resources and affecting the user experience. How to fully reproduce a multi-channel audio signal such as an audio signal of 5.1.2-channel on a television has become an issue that needs to be addressed.

In view of the above, embodiments of the present disclosure provide a display apparatus and a method for processing audio to enable full reproduction of multi-channel audio signal for an output device with a limited number of channels.

The present disclosure will be described in detail in the following embodiments. The following embodiments may be combined with each other, and same or similar concepts or processes will omit in some embodiments.

Figure 2:
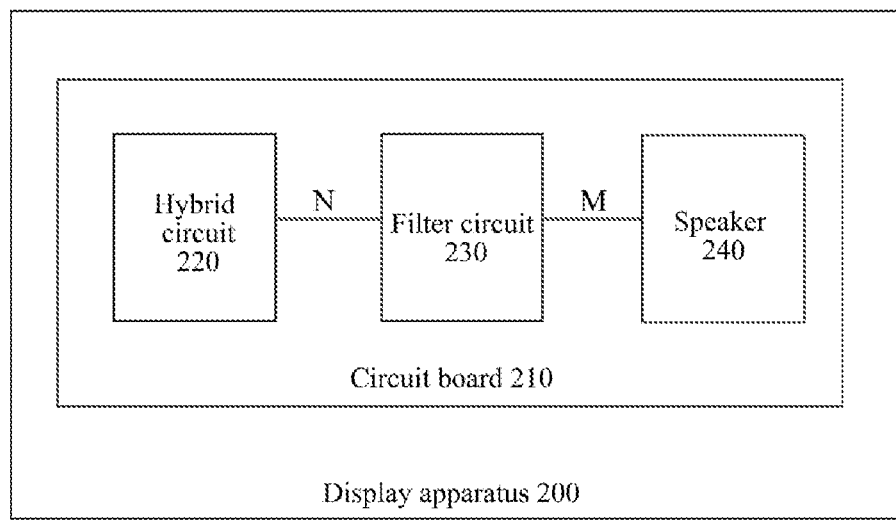
FIG. 2 is a schematic diagram of a display apparatus according to another embodiment of the present disclosure.

FIG. 2 is a schematic diagram of a display apparatus according to another embodiment of the present disclosure. As shown in FIG. 2, the display apparatus 200 includes a circuit board 210, and the circuit board 210 includes a hybrid circuit 220, a filter circuit 230 and a speaker 240.

The hybrid circuit 220 is configured to receive the original audio signal, and superpose a first sub-signal of the original audio signal and a second sub-signal of the original audio signal to obtain the hybrid audio signal; the number of channels of the hybrid audio signal is less than the number of channels of the original audio signal, the first sub-signal includes at least one channel of audio signal, and the second sub-signal includes at least two channels of audio signal. In this embodiment, M represents the number of channels of the original audio signal received by the hybrid circuit 220, and N represents the number of channels of the hybrid audio signal obtained by superposing through the hybrid circuit 220, M and N are both positive integers, and N is less than M.

The filter circuit 230, connected with the hybrid circuit 220, is configured to filter the hybrid audio signal according to a frequency characteristic of the first sub-signal and the second sub-signal to obtain a restored original audio signal. The restored original audio signal and the original audio signal received by the hybrid circuit 220 include the same number of channels, that is, M-channel audio signal.

The speaker 240, connected with the filter circuit 230, is configured to output the restored original audio signal.

In some embodiments, the circuit board 210 may be a main board of a display apparatus. The hybrid circuit 220 may be integrated into a host chip SOC on the main board.

In some embodiments, the original audio signal includes an M-channel audio signal, and the value of M may be any positive integer greater than or equal to 2. For example, M can be 6, that is, the original audio signal can be a 5.1-channel audio signal. Where, the 5-channel may be a surround left channel, a surround right channel, a left main-channel, a right main-channel and a center-channel, and the 0.1 channel is a subwoofer channel; M may also be 8, that is, the original audio signal may be 5.1.2-channel audio signal, where the 5-channel may be a left surround channel, a right surround channel, a left main channel, a right main-channel and a center-channel, the 0.1 channel is a subwoofer channel, and the 0.0.2 channels may be a left height channel and a right height channel. Embodiments of the present disclosure do not intend to limit types of the channels of the audio signal.

In some embodiments, the first sub-signal of the original audio signal for superposing in the hybrid circuit 220 may be any one channel of the original audio signal or any two or more channels of the original audio signal, and the second sub-signal of the original audio signal for superposing in the hybrid circuit 220 may be any two or more channels of the remaining of the original audio signal other than the first sub-signal. That is to say, in this embodiment, not only one channel sub-signal is superposed on at least two channel sub-signal, but also the multiple-channel sub-signal is superposed on the at least two channel sub-signal, which are not limited herein in this embodiment of the present disclosure.

For example, taking 5.1.2-channel original audio signal as an example, the first sub-signal may be any one channel audio signal or any two or more channel audio signal among left surround channel audio signal, right surround channel audio signal, left main-channel audio signal, right main-channel audio signal, center-channel audio signal, subwoofer channel audio signal, left height channel audio signal and right height channel audio signal) of 5.1.2-channel audio signal. When the first sub-signal is a center-channel audio signal, the second sub-signal may be a pair channel of the remaining channel audio signal (left surround channel audio signal, right surround channel audio signal, left main-channel audio signal, right main-channel audio signal, subwoofer channel audio signal, left height channel audio signal and right height channel audio signal) of 5.1.2-channel audio channel, such as left surround channel audio signal and right surround channel audio signal, or left main-channel audio signal and right main-channel audio signal, or left height channel audio signal and right height channel audio signal. When the first sub-signal is left surround channel audio signal and right surround channel audio signal, the second sub-signal may be a pair channel of the remaining channel audio signal (center-channel audio signal, left main-channel audio signal, right main-channel audio signal, subwoofer channel audio signal, left height channel audio signal and right height channel audio signal) of 5.1.2-channel audio signal, such as left main-channel audio signal and right main-channel audio signal, or left height channel audio signal and right height channel audio signal.

In some embodiments, a source of the original audio signal may be various, for example, it may be an audio signal received through a cable television network or through an antenna, and it may also be an audio signal from a DVD device provided in the television or an outer DVD device, which is not limited in this disclosure.

In some embodiments, the frequency characteristic may be a frequency distribution characteristic of the first sub-signal and the second sub-signal. For example, the main-channel audio signal is an audio signal greater than 200 Hz, and the subwoofer channel audio signal is an audio signal less than 220 Hz.

In some embodiments, the filter circuit 230 may perform high-pass filter processing, low-pass filter processing, band-pass filter processing, and the like. Depending on whether the audio signal is a digital signal or an analog signal, a digital filter or an analog filter may be selected accordingly for performing filter processing.

For ease of understanding, a processing process of the audio signal by the display device will be described below. The hybrid circuit 220 receives the original audio signal and superposes the first sub-signal of the original audio signal and the second sub-signal of the original audio signal to obtain the hybrid audio signal. The number of channels of the hybrid audio signal is less than the number of channels of the original audio signal, the first sub-signal includes at least one channel of audio signal, and the second sub-signal includes at least two channels of audio signal. The filter circuit 230 filters the hybrid audio signal according to the frequency characteristic of the first sub-signal and the second sub-signal to obtain the reconstructed original audio signal. The speaker 240 outputs the reconstructed original audio signal.

The display apparatus according to the embodiments superpose any two sub-signals of the original audio signal through the hybrid circuit 220, and then obtain the hybrid audio signal with less channels, and then reconstructs the hybrid audio signal through the filter circuit 230 according to the frequency characteristic of the two sub-signals to obtain the multi-channel audio signal with the same number of channels as the audio signal before hybridized, thereby achieving that the multi-channel audio signal may be perfectly reconstructed, even if the number of channels provided by the existing hardware system is less than the number of channels of the multi-channel audio signal to be processed, so as to ensure the quality of audio output and improve the user experience.

Figure 3:
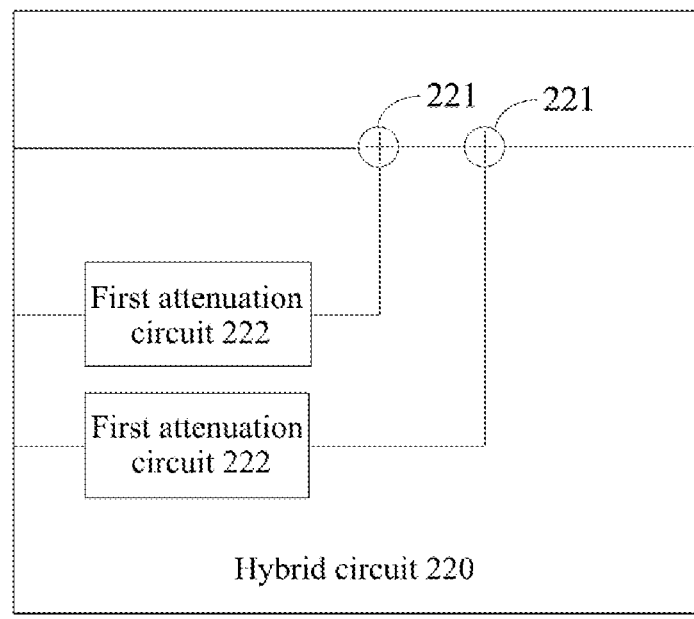
FIG. 3 is a schematic diagram of a hybrid circuit of a display apparatus according to another embodiment of the present disclosure.

FIG. 3 is a schematic diagram of a hybrid circuit of the display apparatus according to another embodiment of the present disclosure. With reference to the embodiments shown in FIG. 2, a description of the structure of the hybrid circuit 220 is described in detail in the present embodiment. As shown in FIG. 3, the hybrid circuit 220 includes: a first addition circuit 221.

The first addition circuit 221 is configured to superpose the first sub-signal and the second sub-signal to obtain the first superposed signal, which is a component of the hybrid audio signal.

In some embodiments, the first sub-signal and the second sub-signal may be digital signal or analog signal. Correspondingly, the superposing process may be realized by digital circuits or analog circuits. The first addition circuit 221 may be an entity apparatus integrated or provided with related execution codes, such as an SOC chip, and may also be an analog adder including an operational amplifier.

Taking 5.1.2-channel original audio signal as an example, when the first sub-signal is a subwoofer channel audio signal, and the second sub-signal is a left height channel audio signal and right height channel audio signal, the subwoofer channel audio signal may be superposed with the left height channel signal and the right height channel signal respectively. When the first sub-signal is a center-channel audio signal, and the second sub-signal is a left surround audio signal and a right surround audio signal, the center-channel audio signal may be superposed with the left surround channel signal and the right surround channel signal. When the first sub-signal is a center-channel audio signal and a subwoofer channel audio signal, and the second sub-signal is a left main-channel audio signal and a right main-channel audio signal, then the subwoofer channel audio signal may be superposed with the left main-channel signal and the right main-channel signal, and then the center-channel audio signal may be superposed with the left main-channel signal and the right main-channel signal respectively. In the present embodiment, the sequence of the first sub-signal to be superposed is not limited herein.

With reference to FIG. 3, in order to ensure that an amplitude of the signal meets a preset range, the hybrid circuit 220 may further include: a first attenuation circuit 222.

The first attenuation circuit 222 is configured to perform attenuating on the first sub-signal to obtain the attenuated first sub-signal.

The first addition circuit 221, connected with the first attenuation circuit 222, is configured to superpose the attenuated first sub-signal and the second sub-signal.

Performing attenuating on the first sub-signal, is equivalent to dividing the first sub-signal into two parts, and superposing the two parts to the left channel component and the right channel component of the second sub-signal through the first addition circuit 221 respectively. Thus, the amplitude of the signal may meet the preset range, avoiding an impact on the other circuits due to the excessive amplitude of the superposed signal.

In some embodiments, the first attenuation circuit is a 3 dB attenuation circuit, i.e. the first sub-signal may be divided into two parts equally. A power of each part is half of that of the first sub-signal, which is facilitated for an accuracy of signal processing.

Figure 4:
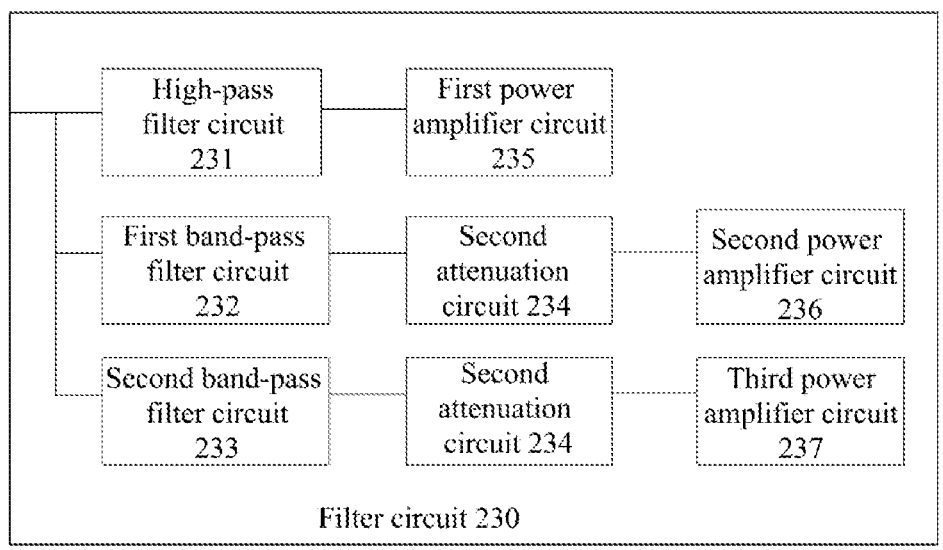
FIG. 4 is a diagram of a filter circuit of a display apparatus according to another embodiment of the present disclosure.

FIG. 4 is a schematic diagram of the filter circuit of the display apparatus according to another embodiment of the present disclosure. On the basis of the above embodiment, for example, according to the embodiments as shown in FIG. 2, a detailed description of the structure of the filter circuit 230 will be described in the present embodiment. As shown in FIG. 4, the second sub-signal is the main-channel audio signal, and the filter circuit 230 includes: a high-pass filter circuit 231.

The high-pass filter circuit 231 is configured to perform high-pass filtering on the first superposed signal with the first frequency threshold to obtain a reconstructed main-channel signal.

The main-channel audio signal includes a signal with a frequency component above a first frequency threshold $\alpha$ including a human voice and a background sound. In some embodiments, $\alpha$ may be set to any frequency between 150 Hz and 250 Hz.

In some embodiments, in order to be able to amplify and play the filtered main-channel audio signal, the filter circuit 230 further includes: a first power amplifier circuit 235, and the speaker 240 includes a first sub-speaker 241.

The first power amplifier circuit 235, connected with the high-pass filter circuit 231, is configured to amplify the reconstructed main-channel signal to obtain the amplified main-channel signal.

The first sub-speaker 241, connected with the first power amplifier circuit 235, is configured to output the amplified main-channel signal.

Referring to FIG. 4, in some embodiments, the first sub-signal is a subwoofer channel audio signal, and the filter circuit 230 further includes: a first band-pass filter circuit 232. The first band-pass filter circuit 232 is configured to perform low-pass filtering on the first superposed signal with the first frequency threshold, and perform high-pass filtering on the first superposed signal with a second frequency threshold, so as to obtain a restored subwoofer channel frequency signal.

The subwoofer channel audio signal includes a frequency component under the first frequency threshold $\alpha$ and above the second frequency threshold $\beta$. In some embodiments, $\beta$ may be set to any frequency between 20 Hz and 60 Hz.

In some embodiments, in order to amplify and play the filtered subwoofer channel audio signal, the filter circuit 230 further includes a second attenuation circuit 234 and a second power amplifier circuit 236, and the speaker 240 includes a second sub-speaker 242.

The second attenuation circuit 234 is configured to attenuate the restored subwoofer channel audio signal to obtain the attenuated subwoofer channel audio signal.

The second power amplifier circuit 236, connected with the second attenuation circuit 234, is configured to amplify the attenuated subwoofer channel audio signal to obtain the amplified subwoofer channel audio signal.

The second sub-speaker 242, connected with the second power amplifier circuit 236, is configured to output the amplified subwoofer channel audio signal.

Referring to FIG. 4, in some embodiments, the first sub-signal is a center-channel audio signal, and the filter circuit 230 further includes: a second band-pass filter circuit 233. The second band-pass filter circuit 233 is configured to perform high-pass filtering on the first superposed signal with a first frequency threshold, and perform low-pass filtering on the superposed first signal with a third frequency threshold to obtain a restored first sub-signal number.

The center-channel audio signal includes a frequency component above the first frequency threshold $\alpha$ and under the third frequency threshold $\gamma$. In some embodiments, $\gamma$ may be set to any frequency between 3000 Hz and 7000 Hz.

On the basis of the above-mentioned embodiments of FIGS. 2 to 4, for the convenience of explanation, referring to FIG. 5, an overall structure and a working principle of the display apparatus are described in detail below.

Figure 5:
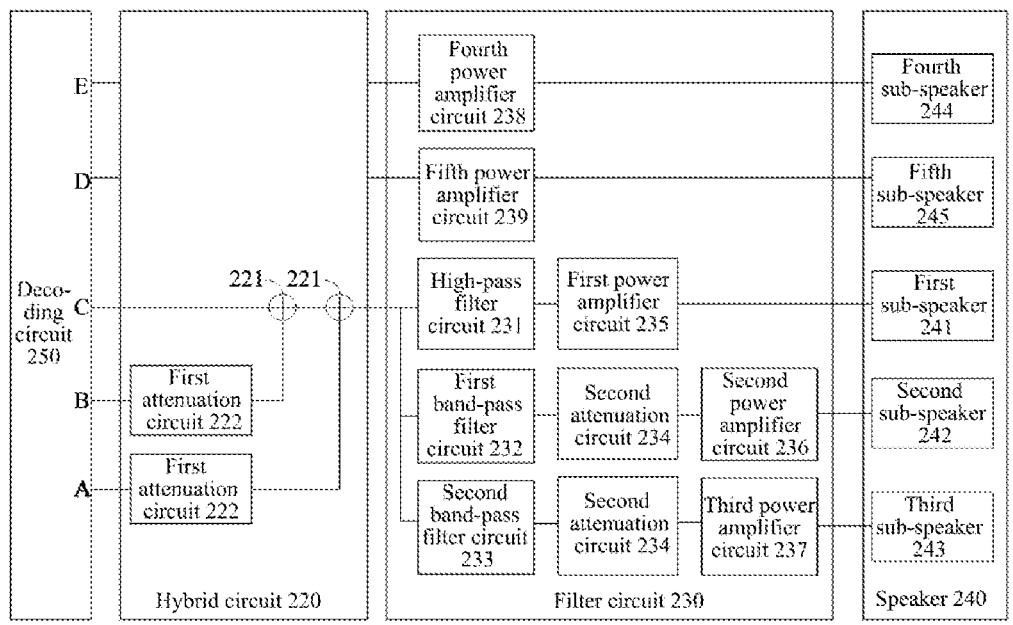
FIG. 5 is a schematic diagram of a display apparatus according to another embodiment of the present disclosure.

FIG. 5 is a schematic diagram of a display apparatus according to another embodiment of the present disclosure. As shown in FIG. 5, the display apparatus according to the present embodiment includes a decoding circuit 250, a hybrid circuit 220, a filter circuit 230 and a speaker 240.

The decoding circuit 250 is configured to receive the original audio signal and decoding the original audio signal to obtain a decoded original audio signal.

The hybrid circuit 220, connected with the decoding circuit 250, is configured to receive the decoded original audio signal, and superpose a first sub-signal of the decoded original audio signal and a second sub-signal of the decoded original audio signal, so as to obtain the hybrid audio signal.

The filter circuit 230, connected with the hybrid circuit 220, is configured to perform filtering on the hybrid audio signal according to the frequency characteristic of the first sub-signal and the second sub-signal to obtain a restored original audio signal.

The speaker 240, connected with the filter circuit 230, is configured to output the restored original audio signal.

Taking 5.1.2-channel original audio signal as an example, the structure of the display apparatus and the audio processing are described.

Referring to FIG. 5, the decoding circuit 250 includes five output ports, in which, port A is configured to output the decoded subwoofer channel audio signal, port B is configured to output the decoded center-channel audio signal, and ports C to E are I2S output ports, where port C is configured to output the left main-channel and right main-channel audio signal, port D is configured to output the left surround channel and the right surround channel audio signal, port E is configured to output the left height channel and right height channel.

The hybrid circuit 220 includes two first attenuation circuits 222 and two first addition circuits 221. The first attenuation circuit 222 connected with port A, is configured to perform attenuating on the subwoofer channel audio signal output from port A, and the attenuated subwoofer channel audio signal is superposed to the left main-channel audio signal and the right main-channel audio signal that output from port C through the first addition circuit 221 connected with the first attenuation circuit 222 connected with port A. Accordingly, the first attenuation circuit 222 connected with port B, is configured to perform attenuating on the center-channel audio signal output from port B, and the attenuated center-channel audio signal is superposed to the left main-channel audio signal and the right main-channel audio signal output from the port C through the first addition circuit 221, to obtain the first superposed signal.

The filter circuit 230 includes a high-pass filter circuit 231, a first band-pass filter circuit 232, a second band-pass filter circuit 233, two second attenuation circuits 234, and five power amplifier circuit (235-239). The speaker 240 includes five sub-speakers (241-245).

Where, the high-pass filter circuit 231 is configured to perform high-pass filtering on the first superposed signal with the first frequency threshold, to obtain a restored main-channel audio signal. The restored main-channel audio signal is amplified through the first power amplifier circuit 235, and output to the first sub-speaker 241.

The first band-pass filter circuit 232 is configured to perform low-pass filtering on the first superposed signal with the first frequency threshold, and perform high-pass filtering on the first superposed signal with the second frequency threshold, to obtain a restored subwoofer channel audio signal. The restored subwoofer channel audio signal is attenuated through the second attenuation circuit 234 connected with the filter circuit 232, and the attenuated subwoofer channel audio signal is amplified through the second power amplifier circuit 236 and output to the second sub-speaker 242.

The second band-pass filter circuit 233 is configured to perform high-pass filtering on the first superposed signal with the first frequency threshold, and perform low-pass filtering on the first superposed signal with the third frequency threshold to obtain a restored center-channel audio signal, the restored center-channel audio signal is attenuated through the second attenuation circuit 234, and the attenuated center-channel audio signal is amplified through the third power amplifier circuit 237 and output to the third sub-speaker 243.

The fourth power amplifier circuit 238, with an input connected with port E of the decoding circuit 250 through the hybrid circuit 220, is configured to receive the left height channel and the right height channel audio signal, amplify them, and output them to the fourth sub-speaker 244.

The fifth power amplifier circuit 239, with an input connected with port D of the decoding circuit 250 through the hybrid circuit 220, is configured to receive the left surround channel and the right surround channel audio signal, amplify them, and output them to the fifth sub-speaker 245.

For ease of understanding, the following describes the superposing process of the hybrid circuit 220 and the filtering process of the filter circuit 230.

Referring to FIG. 5, the decoding circuit 250 and the hybrid circuit 220 may be integrated into a system on chip (SOC) of a television. During the superposing process of the hybrid circuit 220, the original audio signal (5.1.2-channel audio signal) is decoded by the decoding circuit 250 and then output from the five ports A-E of the decoding circuit 250 to the hybrid circuit 220. Where, the decoded left height channel and right height channel audio signal and the decoded left surround channel and right surround channel audio signal are not superposed in the hybrid circuit 220, but are output directly. The decoded subwoofer channel audio signal and the decoded center-channel audio signal are superposed to the left main-channel audio signal and the right main-channel audio signal through the first addition circuit 221, to obtain a first superposed signal (the hybridized left main-channel and right main-channel audio signal). In some embodiments, in order to ensure the signal amplitude to fall in a certain range, the first superposed signal may be obtained by performing attenuating on the subwoofer channel audio signal and the center-channel audio signal through the first attenuation circuit 222 respectively, and then superposing the decoded left main-channel and right main-channel audio signal thereto. The first superposed signal is output through I2S. In a scenario where the system on chip of the television may be able to output three I2S or 6 audio signal at most, the above processing method allows for the above system on chip configured for the television to meet the output of 5.1.2-channel signal.

With reference to FIG. 5, the filtering processing of the audio processing module 101 is described in detail. In the filtering process, according to the characteristic of a frequency distribution of the main-channel audio signal, the subwoofer channel audio signal and the center-channel audio signal (the main-channel audio signal includes a frequency component with a frequency above the first frequency threshold $\alpha$ including the human voice and the background sound, the subwoofer channel audio signal with a frequency component under the first frequency threshold $\alpha$ and above the second frequency threshold $\beta$, and the center-channel audio signal with a frequency component above the first frequency threshold $\alpha$ and below the third frequency threshold $\gamma$), different filtering processes may be carried out for the first superposed signal and the second superposed signal to obtain a restored subwoofer channel audio signal, a restored center-channel audio signal and a restored main-channel audio signal.

The first superposed signal may be filtered to allow the component above $\alpha$ pass through the high-pass filter circuit 231 (in some embodiments, $\alpha$ may be set as any frequency between 150 Hz and 250 Hz), power amplified through the first power amplifier circuit 235 and output to the first sub-speaker 241 for playing. The high-pass filtering and power amplifying may be carried out by a high-pass filter circuit and a power amplifier circuit separately, and may also be completed by a power amplifier circuit integrated with a high-pass filtering function, which is not limited in the present disclosure.

Furthermore, in order to obtain a restored subwoofer channel audio signal, the first superposed signal may be filtered to allow the component below $\alpha$ and above $\beta$ pass through the first band-pass filter circuit 232 (in some embodiments, $\beta$ may be set to any frequency between 20 Hz and 60 Hz). Further, two paths of audio signal in a frequency range under $\alpha$ and above $\beta$ obtained, are attenuated 3 dB through the second attenuation circuit 234, and then are superposed into one path of signal, which is power amplified through the second power amplifier circuit 236 and is output to the second sub-speaker 242 for playing. There is no difference between the playing effect of the restored subwoofer channel audio signal and that of one channel of subwoofer channel audio signal specially output from the SOC, allowing to realize a perfect reproduction of the subwoofer channel audio signal. The aforementioned high-pass filtering, low-pass filtering, attenuating, superposing and power amplifying performed to the first superposed signal may be completed by separated elements corresponding to each function, and may also be completed by a power amplifier integrated with these various functions, which is not limited in the present disclosure.

Furthermore, in order to obtain a restored center-channel audio signal, the first superposed signal may be filtered by high-pass filtering the component above α and by low pass filtering the component under γ. (In some embodiments, γ may be set to any frequency between 3000 Hz and 7000 Hz) through the second band-pass filter circuit 233, to filter out a main frequency range of the human voice and to obtain two paths of audio signal in a frequency range above α and under γ. The two paths of audio signal are attenuated 3 dB through the second attenuation circuit 234 and are superposed into one path of signal, which is amplified by the third power amplifier circuit 237 and then output to the third sub-speaker 243 for playing. The above operations of high-pass filtering, low-pass filtering, attenuating, superposing and power amplifying performed to the first superposed signal may be completed by separate elements corresponding to each function, and may also be completed by a power amplifier integrated with these various functions, which is not limited in the present disclosure.

After the above process, the original eight-channel audio signal (5.1.2-channel audio signal) is synthesized into a six-channel signal through the SOC (integrated with the decoding circuit 250 and the hybrid circuit 220), and output to the filter circuit 230, and then an audio signal, same with the eight-channel audio signal output from the system on chip, is restored by filtering and amplifying functions of the filter circuit 230, which achieves the effect of reproducing the eight-channel audio signal by outputting the six-channel audio signal through the system on chip (SOC). That is to say, even if the number of channels provided by an existing hardware system is less than the number of channels of the multi-channel audio signal to be processed, the multi-channel audio signal to be processed may also be completely reproduced, so as to ensure the quality of audio output and improve the user experience.

Figure 6:
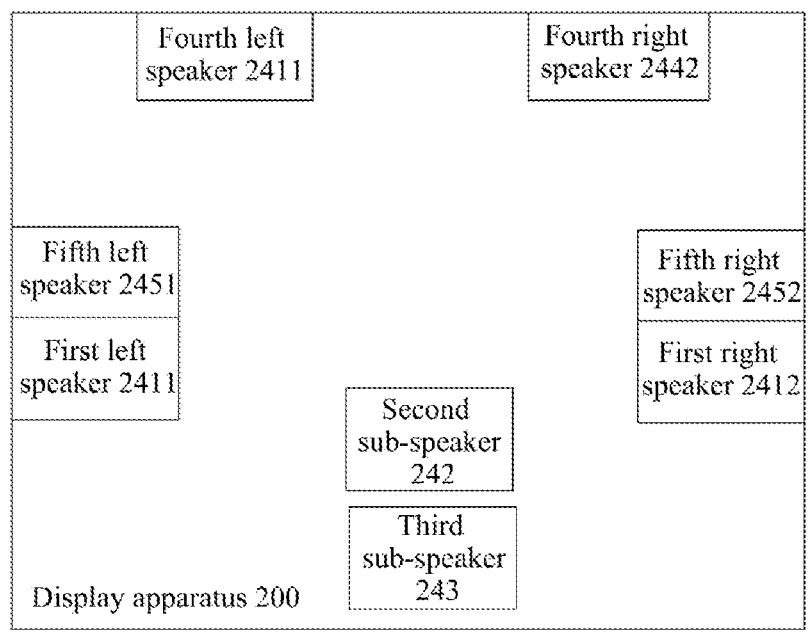
FIG. 6 is a schematic diagram of a speaker of a display apparatus according to another embodiment of the present disclosure.

On the basis of the above embodiments, taking the television as a display apparatus example, and referring to FIG. 6, a position arrangement of the speaker is described in detail.

FIG. 6 is a schematic diagram of a speaker of the display apparatus according to another embodiment of the present disclosure. As shown in FIG. 6, the first sub-speaker 241 includes a first left speaker 2411 for playing the reconstructed left channel main-channel audio signal, and a first right speaker 2412 for playing the reconstructed right channel main-channel audio signal. The first left speaker 2411 and the first right speaker 2412 are respectively arranged on a left side and a right side in the middle of the television. The second sub-speaker 242 for playing the reconstructed subwoofer channel audio signal and the third sub-speaker 243 for playing the reconstructed center-channel audio signal are both arranged at the bottom of the television. The fourth sub-speaker 244 includes a fourth left speaker 2441 for playing the restored left height channel audio signal, and a fourth right speaker 2442 for playing the restored right height channel audio signal. The fourth left speaker 2441 and the fourth right speaker 2442 are respectively arranged on the left side and the right side on top of the television. The fifth sub-speaker 245 includes a fifth left speaker 2451 for playing the restored left surround channel audio signal, and a fifth right speaker 2452 for playing the restored right surround channel audio signal. The fifth left speaker 2451 and the fifth right speaker 2452 are respectively arranged on the left side and the right side in the middle of the television. In this embodiment, a television is taken as an example to illustrate, and the speakers may also be arranged on a computer, a tablet and other display devices.

The television according to the embodiments of the present disclosure, by receiving the multi-channel audio signal through the hybrid circuit, superposing the first sub-signal of the original audio signal and the second sub-signal of the original audio signal to obtain a hybrid audio signal, and according to the frequency characteristic of the first sub-signal and the second sub-signal, filtering the hybrid audio signal through the filter circuit to obtain a restored original audio signal, and the restored original audio signal is respectively played and output through each sub-speaker of the speaker, which enables that even if the number of channels provided by an existing hardware system is less than the number of channels of the multi-channel audio signal to be processed, the multi-channel audio signal to be processed may also be perfectly reconstructed, so as to ensure the quality of audio output and improve the user experience.

Figure 7:
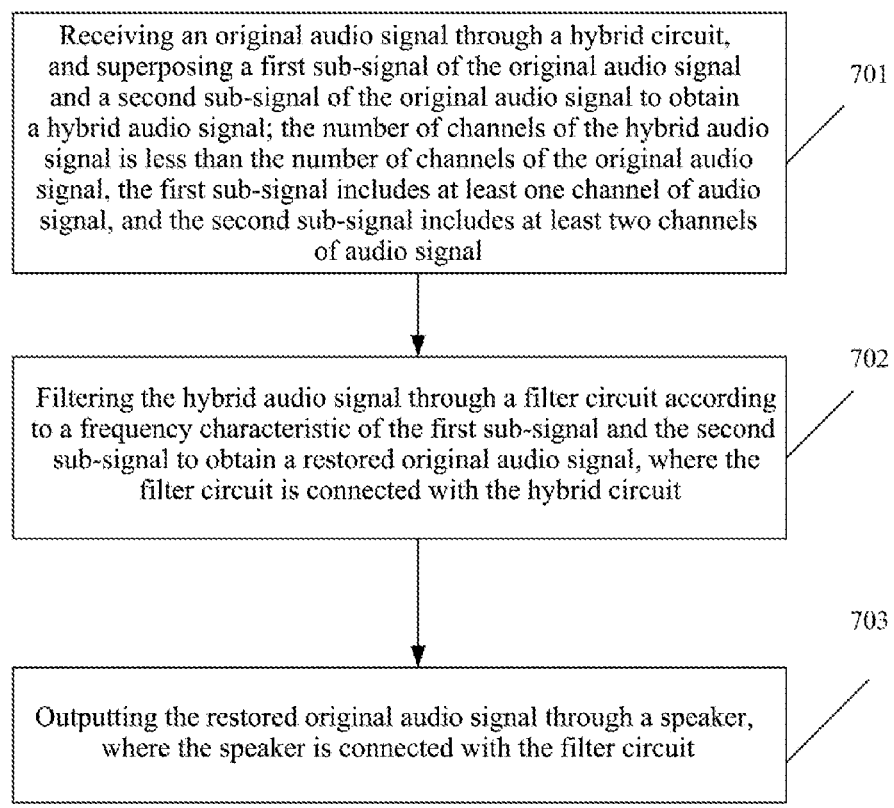
FIG. 7 is a schematic flowchart of a method for processing audio according to an embodiment of the present disclosure.

FIG. 7 is a schematic flowchart of a method for processing audio according to embodiments of the present disclosure. As shown in FIG. 7, the method for processing audio includes steps 701 to 703.

Step 701: receiving an original audio signal through a hybrid circuit, and superposing a first sub-signal of the original audio signal and a second sub-signal of the original audio signal to obtain a hybrid audio signal; the number of channels of the hybrid audio signal is less than the number of channels of the original audio signal, the first sub-signal includes at least one channel of audio signal, and the second sub-signal includes at least two channels of audio signal.

Step 702: filtering the hybrid audio signal according to a frequency characteristic of the first sub-signal and the second sub-signal through a filter circuit to obtain a restored original audio signal, where the filter circuit is connected with the hybrid circuit.

Step 703: outputting the restored original audio signal through a speaker, where the speaker is connected with the filter circuit.

In some embodiments, the hybrid circuit includes a first addition circuit; the method may include:

superposing the first sub-signal and the second sub-signal through the first addition circuit to obtain a first superposed signal; the first superposed signal is a path of the hybrid audio signal.

In some embodiments, the hybrid circuit includes a first attenuation circuit and a first addition circuit; and the method may include:

attenuating the first sub-signal through the first attenuation circuit to obtain an attenuated first sub-signal; and superposing the attenuated first sub-signal and the second sub-signal through the first addition circuit to obtain a first superposed signal, where the first addition circuit is connected to the first attenuation circuit.

In some embodiments, the second sub-signal is a main-channel audio signal, and the filter circuit includes a high-pass filter circuit; the method may include:

performing high-pass filtering on the first superposed signal with a first frequency threshold through the high-pass filter circuit to obtain a restored main-channel signal.

In some embodiments, the filter circuit further includes: a first power amplifier circuit; the speaker includes a first sub-speaker; and the method may include:

amplifying the restored main-channel signal through the first power amplifier circuit to obtain an amplified main-channel signal, where the first power amplifier circuit is connected to the high-pass filter circuit; and outputting the amplified main-channel signal through the first sub-speaker, and the first sub-speaker is connected to the first power amplifier circuit.

In some embodiments, the first sub-signal is a subwoofer channel audio signal, and the filter circuit further includes: a first band-pass filter circuit; the method may include:

performing low-pass filtering on the first superposed signal with a first frequency threshold through the first band-pass filter circuit, and perform high-pass filtering on the first superposed signal with a second frequency threshold to obtain a restored subwoofer channel audio signal.

In some embodiments, the filter circuit further includes: a second attenuation circuit and a second power amplifier circuit; the speaker includes a second sub-speaker; and the method may include:

attenuating the restored subwoofer channel audio signal through the second attenuation circuit to obtain an attenuated subwoofer channel audio signal;

amplifying the attenuated subwoofer channel audio signal through the second power amplifier circuit to obtain an amplified subwoofer channel audio signal, where the second power amplifier circuit is connected to the second attenuation circuit; and outputting the amplified subwoofer channel audio signal through the second sub-speaker, where the second sub-speaker is connected to the second power amplifier circuit.

In some embodiments, the first sub-signal is a center-channel audio signal, and the filter circuit further includes a second band-pass filter circuit; the method may include:

performing high-pass filtering on the first superposed signal with a first frequency threshold through the second band-pass filter circuit, and performing low-pass filtering on the first superposed signal with a third frequency threshold to obtain a restored first sub-signal.

In some embodiments, the method may further include:

receiving the original audio signal and decoding the original audio signal through a decoding circuit to obtain a decoded original audio signal; and receiving the decoded original audio signal, and superposing a first sub-signal of the decoded original audio signal on a second sub-signal of the decoded original audio signal through the hybrid circuit, to obtain the hybrid audio signal.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A display apparatus, comprising: a circuit board with a hybrid circuit, a filter circuit, and a speaker, wherein:
    the hybrid circuit is configured to receive an original audio signal, and superpose a first sub-signal of the original audio signal and a second sub-signal of the original audio signal to obtain a hybrid audio signal, wherein the number of channels of the hybrid audio signal is less than the number of channels of the original audio signal, the first sub-signal comprises at least one channel of audio signal, and the second sub-signal comprises at least two channels of audio signal; wherein the hybrid circuit comprises: a first addition circuit, the first addition circuit is configured to superpose the first sub-signal and the second sub-signal to obtain a first superposed signal, and the first superposed signal is a path of the hybrid audio signal;
    the filter circuit, in connection with the hybrid circuit, is configured to filter the hybrid audio signal according to a frequency characteristic of the first sub-signal and the second sub-signal to obtain a restored original audio signal, wherein the second sub-signal is a main-channel audio signal, and the filter circuit comprises a high-pass filter circuit, configured to perform high-pass filtering on the first superposed signal with a first frequency threshold to obtain a restored main-channel signal; and
    the speaker, in connection with the filter circuit, is configured to output the restored original audio signal.

2. The display apparatus according to claim 1, wherein the hybrid circuit further comprises: a first attenuation circuit, wherein:
    the first attenuation circuit is configured to perform attenuating on the first sub-signal to obtain an attenuated first sub-signal; and
    the first addition circuit, in connection with the first attenuation circuit, is configured to superpose the attenuated first sub-signal and the second sub-signal to obtain a first superposed signal.

3. The display apparatus according to claim 1, wherein the filter circuit further comprises a first power amplifier circuit, and the speaker comprises a first sub-speaker, wherein:
    the first power amplifier circuit, in connection with the high-pass filter circuit, is configured to amplify the restored main-channel signal to obtain an amplified main-channel signal; and
    the first sub-speaker, in connection with the first power amplifier circuit, is configured to output the amplified main-channel signal.

4. The display apparatus according to claim 1, wherein the first sub-signal is a subwoofer channel audio signal, and the filter circuit further comprises a first band-pass filter circuit, wherein:
    the first band-pass filter circuit is configured to perform low-pass filtering on the first superposed signal with the first frequency threshold, and perform high-pass filtering on the first superposed signal with a second frequency threshold to obtain a restored subwoofer channel audio signal.

5. The display apparatus according to claim 4, wherein the filter circuit further comprises a second attenuation circuit and a second power amplifier circuit, and the speaker comprises a second sub-speaker, wherein:
    the second attenuation circuit is configured to attenuate the restored subwoofer channel audio signal to obtain an attenuated subwoofer channel audio signal;
    the second power amplifier circuit, in connection with the second attenuation circuit, is configured to amplify the attenuated subwoofer channel audio signal to obtain an amplified subwoofer channel audio signal; and
    the second sub-speaker, in connection with the second power amplifier circuit, is configured to output the amplified subwoofer channel audio signal.

6. The display apparatus according to claim 1, wherein the first sub-signal is a center-channel audio signal, and the filter circuit further comprise a second band-pass filter circuit;
    the second band-pass filter circuit is configured to perform high-pass filtering on the first superposed signal with the first frequency threshold, and perform low-pass filtering on the first superposed signal with a third frequency threshold to obtain a restored first sub-signal.

7. The display apparatus according to claim 1, wherein the display apparatus further comprises a decoding circuit, wherein:
the decoding circuit is configured to receive the original audio signal and decoding the original audio signal to obtain a decoded original audio signal; and
the hybrid circuit is configured to receive the decoded original audio signal, and superpose a first sub-signal of the decoded original audio signal on a second sub-signal of the decoded original audio signal, to obtain a hybrid audio signal.

8. The display apparatus according to claim 1, wherein the display apparatus is a television.

9. A method for processing audio, comprising:
receiving an original audio signal through a hybrid circuit, and superposing a first sub-signal of the original audio signal and a second sub-signal of the original audio signal to obtain a hybrid audio signal, wherein the number of channels of the hybrid audio signal is less than the number of channels of the original audio signal, the first sub-signal comprises at least one channel of audio signal, and the second sub-signal comprises at least two channels of audio signal;
filtering the hybrid audio signal according to a frequency characteristic of the first sub-signal and the second sub-signal through a filter circuit to obtain a restored original audio signal, wherein the filter circuit is connected with the hybrid circuit; and
outputting the restored original audio signal through a speaker, wherein the speaker is connected with the filter circuit;
wherein the hybrid circuit comprises a first addition circuit; the method comprising:
superposing the first sub-signal and the second sub-signal through the first addition circuit to obtain a first superposed signal, wherein the first superposed signal is a path of the hybrid audio signal;
wherein the second sub-signal is a main-channel audio signal, and the filter circuit comprises a high-pass filter circuit the method comprising:
performing high-pass filtering on the first superposed signal with a first frequency threshold through the high-pass filter circuit to obtain a restored main-channel signal.

10. The method for processing audio according to claim 9, wherein the hybrid circuit further comprises: a first attenuation circuit;
the method comprising:
attenuating the first sub-signal through the first attenuation circuit to obtain an attenuated first sub-signal; and
superposing the attenuated first sub-signal and the second sub-signal through the first addition circuit to obtain a first superposed signal, wherein the first addition circuit is connected to the first attenuation circuit.

11. The method for processing audio according to claim 9, wherein the filter circuit further comprises a first power amplifier circuit, and the speaker comprises a first sub-speaker;
the method comprising:
amplifying the restored main-channel signal through the first power amplifier circuit to obtain an amplified main-channel signal, wherein the first power amplifier circuit is connected to the high-pass filter circuit; and
outputting the amplified main-channel signal through the first sub-speaker, and the first sub-speaker is connected to the first power amplifier circuit.

12. The method for processing audio according to claim 9, wherein the first sub-signal is a subwoofer channel audio signal, and the filter circuit further comprises a first band-pass filter circuit;
the method comprising:
performing low-pass filtering on the first superposed signal with a first frequency threshold through the first band-pass filter circuit, and performing high-pass filtering on the first superposed signal with a second frequency threshold to obtain a restored subwoofer channel audio signal.

13. The method for processing audio according to claim 12, wherein the filter circuit further comprises a second attenuation circuit and a second power amplifier circuit, and the speaker comprises a second sub-speaker;
the method comprising:
attenuating the restored subwoofer channel audio signal through the second attenuation circuit to obtain an attenuated subwoofer channel audio signal;
amplifying the attenuated subwoofer channel audio signal through the second power amplifier circuit to obtain an amplified subwoofer channel audio signal, wherein the second power amplifier circuit is connected to the second attenuation circuit; and
outputting the amplified subwoofer channel audio signal through the second sub-speaker, wherein the second sub-speaker is connected to the second power amplifier circuit.

14. The method for processing audio according to claim 9, wherein the first sub-signal is a center-channel audio signal, and the filter circuit further comprises a second band-pass filter circuit;
the method comprising:
performing high-pass filtering on the first superposed signal with the first frequency threshold through the second band-pass filter circuit, and performing low-pass filtering on the first superposed signal with a third frequency threshold to obtain a restored first sub-signal.

15. The method for processing audio according to claim 9, further comprising:
receiving the original audio signal and decoding the original audio signal through a decoding circuit, to obtain a decoded original audio signal; and
receiving the decoded original audio signal, and superposing a first sub-signal of the decoded original audio signal and a second sub-signal of the decoded original audio signal through the hybrid circuit, to obtain the hybrid audio signal.

* * * * *